(12) United States Patent
Chang et al.

(10) Patent No.: US 10,672,648 B2
(45) Date of Patent: Jun. 2, 2020

(54) METHOD OF FORMING SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Yi-Wang Zhan, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/937,849

(22) Filed: Mar. 27, 2018

(65) Prior Publication Data
US 2018/0286867 A1    Oct. 4, 2018

(30) Foreign Application Priority Data

Mar. 31, 2017    (CN) .......................... 2017 1 0206257

(51) Int. Cl.
*H01L 21/768* (2006.01)
*H01L 27/108* (2006.01)
*H01L 21/311* (2006.01)

(52) U.S. Cl.
CPC .. *H01L 21/76804* (2013.01); *H01L 21/31116* (2013.01); *H01L 21/31144* (2013.01); *H01L 21/76802* (2013.01); *H01L 21/76843* (2013.01); *H01L 21/76877* (2013.01);
(Continued)

(58) Field of Classification Search
None
See application file for complete search history.

(56) References Cited

U.S. PATENT DOCUMENTS

| 4,900,695 A | * | 2/1990 | Takahashi | ............. | H01L 21/768 250/492.2 |
| 5,872,048 A | * | 2/1999 | Reinberg | .......... | H01L 21/76838 257/E21.582 |

(Continued)

OTHER PUBLICATIONS

Chang, Title of Invention: Capacitor Structure and Fabrication Method Thereof, U.S. Appl. No. 15/856,084, filed Dec. 28, 2017.

*Primary Examiner* — Anthony Ho
*Assistant Examiner* — Kevin Quinto
(74) *Attorney, Agent, or Firm* — Winston Hsu

(57) ABSTRACT

A method of forming a semiconductor memory device includes following steps. First of all, a dielectric layer is formed on a semiconductor substrate, and a conductive pad is formed in the dielectric layer. Then, a stacked structure is formed on the dielectric layer, and the stacked structure includes a first layer, a second layer and a third layer stacked one over another on the conductive pad. Next, a patterned mask layer is formed on the stacked structure, and a portion of the stacked structure is removed, to form an opening in the stacked structure, with the opening having a tapered sidewall in the second layer and the first layer. After that, the tapered sidewall of the opening in the second layer is vertically etched, to form a contact opening in the stacked structure. Finally, the patterned mask layer is removed.

16 Claims, 4 Drawing Sheets

(52) U.S. Cl.
CPC .. *H01L 21/76895* (2013.01); *H01L 27/10823* (2013.01); *H01L 27/10855* (2013.01)

(56) References Cited

U.S. PATENT DOCUMENTS

| | | | |
|---|---|---|---|
| 8,772,148 B1* | 7/2014 | Wang | H01L 29/772 |
| | | | 257/288 |
| 9,240,441 B2 | 1/2016 | Yoon et al. | |
| 9,287,270 B2 | 3/2016 | Oh et al. | |
| 2002/0008323 A1* | 1/2002 | Watanabe | H01L 21/76807 |
| | | | 257/758 |
| 2011/0143532 A1* | 6/2011 | Bai | H01L 21/76802 |
| | | | 438/637 |
| 2016/0020170 A1* | 1/2016 | Ho | H01L 24/24 |
| | | | 257/774 |
| 2017/0110401 A1* | 4/2017 | Lii | H01L 24/02 |

* cited by examiner

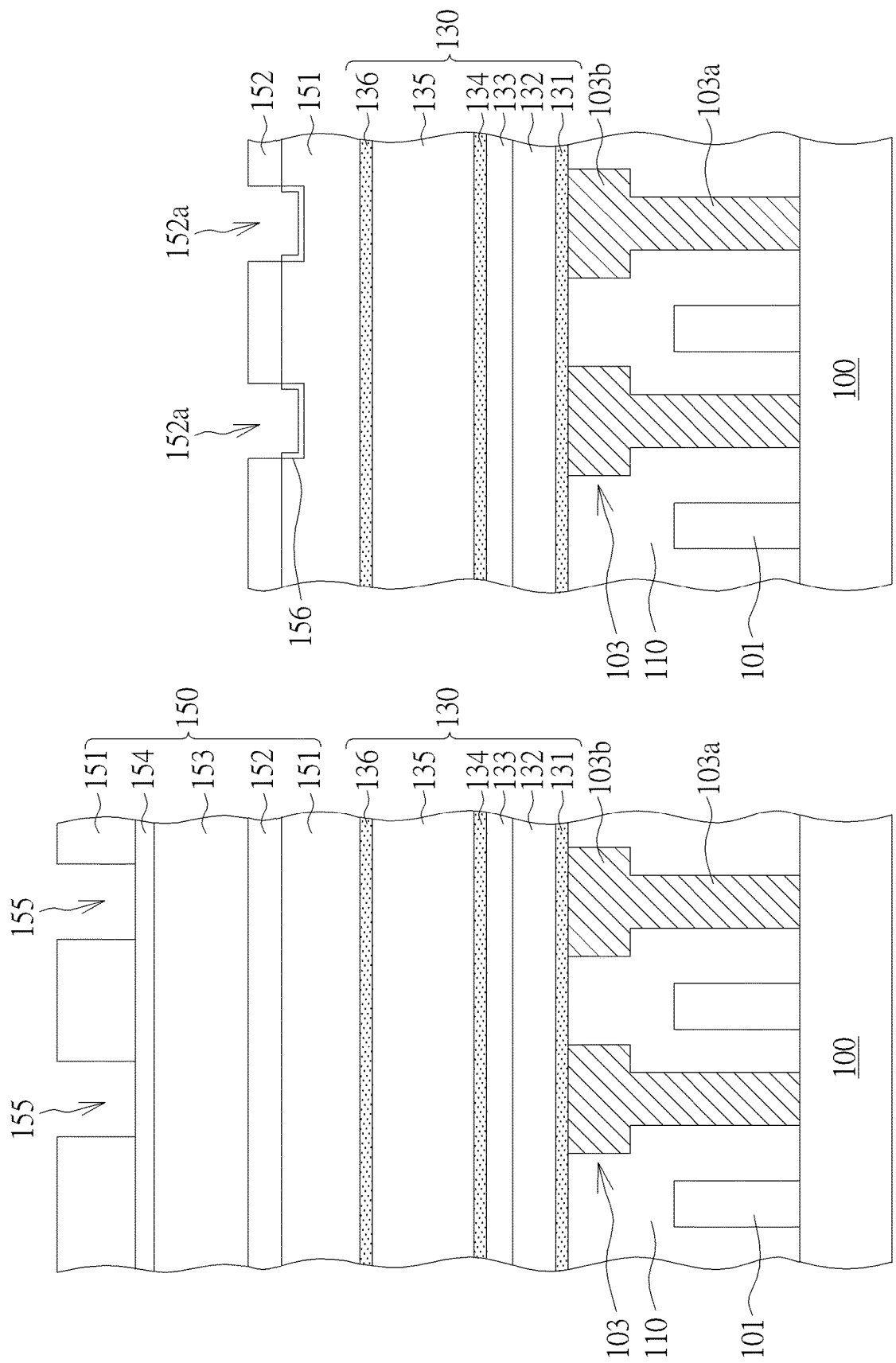

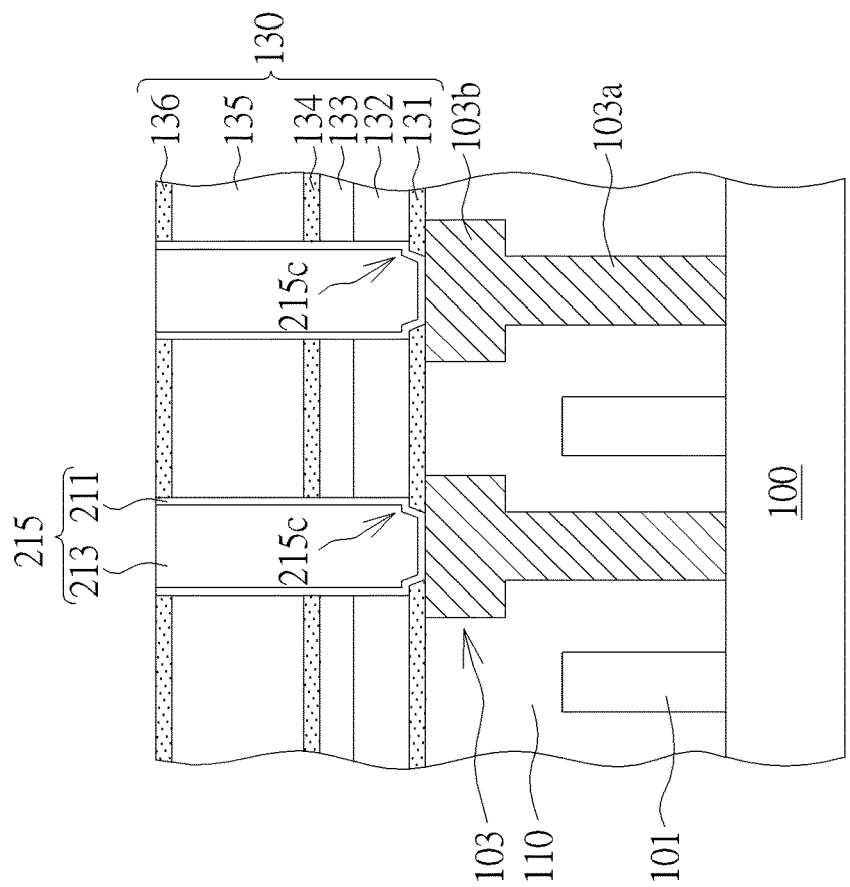
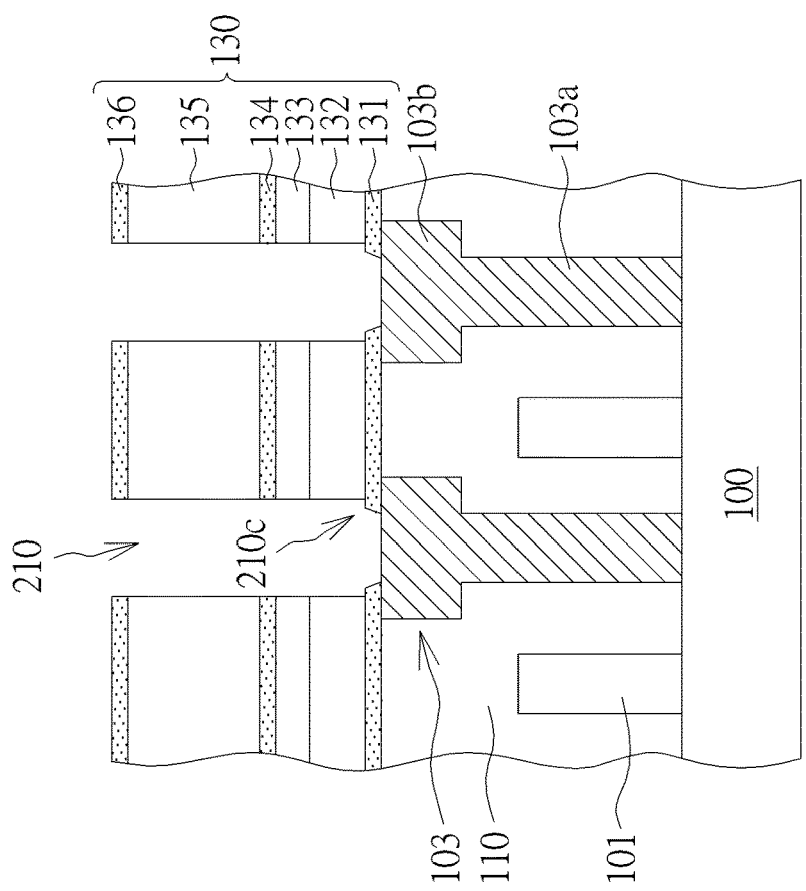

METHOD OF FORMING SEMICONDUCTOR MEMORY DEVICE

BACKGROUND OF THE INVENTION

1. Field of the Invention

The present invention generally relates to the field of forming a semiconductor memory devices, and more particularly to forming a dynamic random access memory (DRAM) device.

2. Description of the Prior Art

For years the trend in the memory industry as well as the semiconductor industry has been to scale down the size of memory cells in order to increase the integration level and thus the memory capacity of a dynamic random access memory (DRAM) chip. In general, the DRAM device is consisted of a large number of memory cell in a DRAM array, with each of the memory cell including a transistor device and a charge storage device, to accept signals from a bit line (BL) and a word line (WL) during the operation. However, due to limitations in fabrication technologies, many defects are formed in the DRAM cell. Therefore, there is still a need to provide an improved memory cell with a buried gate to gain enhanced performance and reliability of the corresponding memory device.

SUMMARY OF THE INVENTION

One object of the present invention is to provide a method of forming a semiconductor memory device, in which, a contact opening with a high aspect ratio is formed in a stacked structure under a simplified process, to expose the storage node pad underneath. The contact opening preferably includes a vertical sidewall, and the capacity structure of the semiconductor memory device may therefore maintain at a particular capacitance value.

To achieve the purpose described above, the present invention provides a method of forming a semiconductor memory device including the following steps. Firstly, a dielectric layer is formed on a semiconductor substrate, and a conductive pad is formed in the dielectric layer. Then, a stacked structure is formed on the dielectric layer, the stacked structure having a first layer, a second layer and a third layer stacked one over another on the conductive pad. Next, a patterned mask layer is formed on the stacked structure, and a portion of the stacked structure is removed, to form an opening in the stacked structure, the opening having a tapered sidewall in the second layer and the first layer. Following these, the tapered sidewalls of the opening in the second layer is vertically etched, to form a contact opening in the stacked structure. Finally, the patterned mask layer is completely removed.

The forming method of the present invention namely adjusts the structure defect of the primary opening with a high aspect ratio while performing the removing process of the patterned mask layer. The removing process is performed by using a vacuum machine to create a low bias and atmosphere free environment, to enhance the etching selectivity between the patterned mask layer and the stacked structure underneath. In addition, through the present forming method, the tapered sidewall at the bottom of the primary opening is vertical etched while removing the protection layer, followed by selectivity removing the first mask layer. In this way, it is sufficient to improve the structural defect of the primary opening while removing the patterned mask layer, thereby forming a semiconductor memory device with improved structure, such as a dynamic random access memory (DRAM) device, and providing better element performance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 are schematic diagrams illustrating a method of forming a semiconductor memory device according to a preferred embodiment of the present invention, wherein:

FIG. 1 shows a cross-sectional view of a semiconductor memory device at the beginning of the forming process;

FIG. 2 shows a cross-sectional view of a semiconductor memory device after forming a primary opening;

FIG. 3 shows a cross-sectional view of a semiconductor memory device after forming a patterned mask layer;

FIG. 4 shows a cross-sectional view of a semiconductor memory device after forming an opening;

FIG. 5 shows a cross-sectional view of a semiconductor memory device after forming a contact opening;

FIG. 6 shows a cross-sectional view of a semiconductor memory device after removing the patterned mask layer;

FIG. 7 shows a cross-sectional view of a semiconductor memory device after forming a plug.

DETAILED DESCRIPTION

To provide a better understanding of the present invention, preferred embodiments will be described in detail. The preferred embodiments of the present invention are illustrated in the accompanying drawings with numbered elements.

Figure 3:
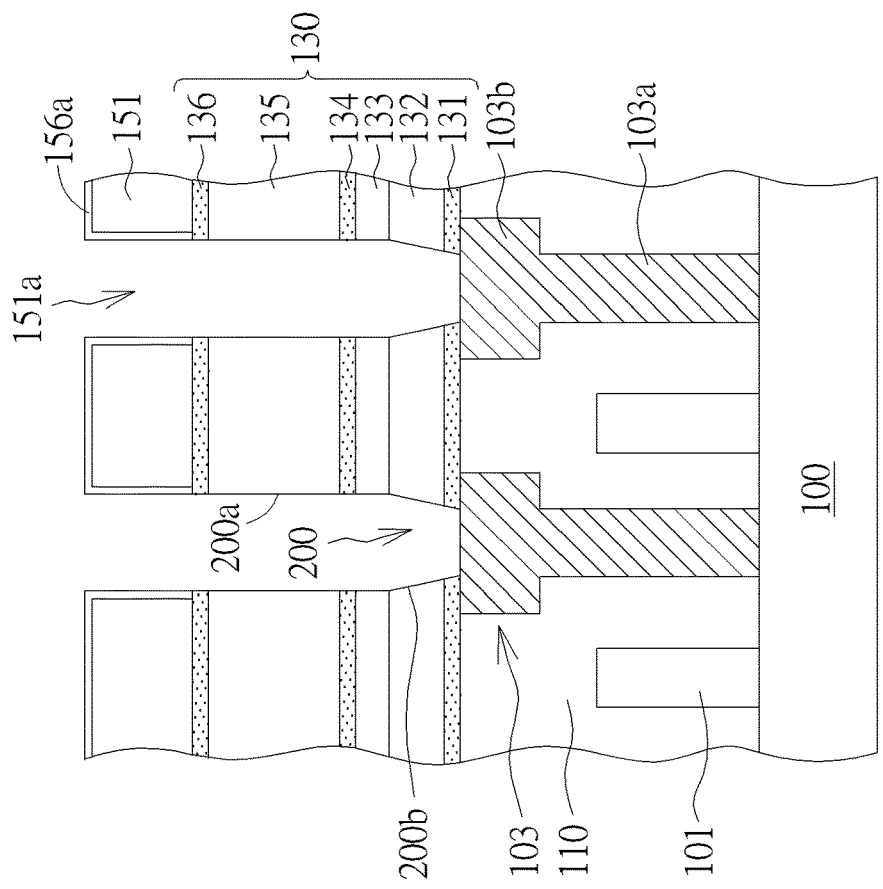

Referring to FIGS. 1-3, FIGS. 1-3 illustrate a dynamic random access memory (DRAM) device according to a preferred embodiment of the present invention, in which FIG. 1 is a schematic top view of the DRAM device and FIGS. 2 and 3 are cross-sectional views taken along the line A-A' and the line B-B' respectively. In the present embodiment, a memory cell such as a DRAM device 110 with a buried gate is provided, the DRAM device 110 includes at least one transistor (not shown in the drawings) and at least one capacitor structure (not shown in the drawings), thereto serve as the smallest unit in the DRAM array for accepting signals from word lines 120 and bit lines 160 during the operation.

Please refer to FIG. 1 and FIG. 7, which illustrate a method of forming a semiconductor memory device according to a preferred embodiment of the present invention. The semiconductor memory device for example includes a dynamic random access memory (DRAM) device, and which includes at least one transistor structure (not shown in the drawings) and at least capacitor structure (not shown in the drawings), to serve as a memory cell in the DRAM array to accept signals from bit lines (BL) 101 and word lines (WLs, not shown in the drawings) during the operation.

In the present embodiment, the semiconductor memory device includes a substrate 100 such as a silicon substrate, a silicon containing substrate (such as SiC, SiGe) or a silicon-on-insulator (SOI) substrate, and then, a buried transistor (not shown in the drawings) is formed in the substrate 100, and a bit line structure 101 and a conductive structure 103 is formed on the substrate 100. The bit line structure 101 and the conductive structure 103 are namely formed in a dielectric layer 110 disposed on the substrate 100, and the dielectric layer 110 for example includes silicon nitride (SiN), but is not limited thereto. Precisely, the bit line structure 101 is electrically connected to a source/drain region (not shown in the drawings) of the transistor structure through a bit line contact (BLC, not shown in the drawings) disposed below a part of the bit line structure 101, and the conductive structure 103 is electrically connected to another source/drain region (not shown in the drawings) directly through a silicide layer (not shown in the drawings) disposed on surfaces of the substrate 100. Also, the conductive structure 103 includes a plug 130a disposed at the bottom thereof, and a conductive pad 130b disposed at the top thereof. The plug 130a is directly in contact with the silicide layer, to configure as a storage node contact (SNC), and the plug 130a and the conductive pad 130b together form a storage node (SN) pad.

As shown in FIG. 1, a stacked structure 130 and a mask structure 150 are sequentially formed on the dielectric layer 110. The stacked structure 130 includes plural films with various materials alternately stacked on one over another. In the present embodiment, the stacked structure 130 includes a first layer 131 for example including SiN, a second layer 132 for example including borophosphosilicate glass (BPSG), a fourth layer 133 for example including silicon dioxide ($SiO_2$), a fifth layer 134, a third layer 135 and a sixth layer 136 stacked from bottom to top. In one embodiment, a thickness of the second layer 132 is preferably greater than a thickness of the first layer 131, such as being two to three times greater than the thickness of the first layer 131, and a thickness of the third layer 135 is preferably greater than the thickness of the second layer 132, such as being two to three times greater than the thickness of the first layer 132, but is not limited thereto. The mask structure 150 also includes plural films with various materials alternately stacked on one over another, and which includes a first mask layer 151, a second mask layer 152 for example including silicon oxide, a third mask layer 153 for example including organic dielectric layer (ODL), a fourth mask layer 154 for example including silicon-containing hard mask (SHB), and a fifth mask layer 155 for example including a photoresist layer like KrF stacked from bottom to top, but is not limited thereto. The fifth mask layer 155 includes at least one opening patterns 155a. It is noted that, the first mask layer 151 preferably includes a material having a great etching selectivity related to the stacked structure 130, such as amorphous silicon (a-Si), but is not limited thereto.

Then, the opening pattern 155a of the fifth mask layer 155 is transferred into the mask layers underneath, and a part of the mask structure 150 is removed. In the present embodiment, an etching process is performed, to transfer the opening pattern 155a of the fifth mask layer 155 sequentially into the second mask layer 152 and a portion of the first mask layer 151 at the bottom of the mask structure 150, to form a primary opening 152a, as shown in FIG. 2. It is noted that, while transferring the opening pattern 155a into the second mask layer 152, surfaces of the first mask layer 151 underneath are exposed, and then etched. At this time, the exposed surfaces of the first mask layer 151 may naturally react with atmosphere in the environment, to form a protection layer 156 thereby. The protection layer 156 for example includes an oxide layer like a silicon oxide layer. Then, the fifth mask layer 155, the fourth mask layer 154 and the third mask layer 153 are completely removed.

As shown in FIG. 3, the first mask layer 151 is continuously etched to form a corresponding opening 151a in the first mask layer 151. That is, the first mask layer 151 having the corresponding opening 151a is allowable to be used as a patterned mask layer, to further etch the stacked structure 130 underneath. Please noted that, the exposed portion of the first mask layer 151 is increasing during etching the first mask layer 151 to form the opening 151a, and those exposed portion of the first mask layer 151 also reacts with the atmosphere in the environment, to form a protection layer 156a.

Next, the second mask layer 152 is completely removed, and then, more surfaces of the first mask layer 151 are exposed, followed by naturally reacting with the atmosphere in the environment to form the protection layer 156a. In the present embodiment, the protection layer 156a is uniformly formed on sidewalls of the opening 151a, and on a top surface of the first mask layer 151, as shown in FIG. 4.

Following these, another etching process such as a dry etching process is performed, using the patterned mask layer (namely the first mask layer 151 with the opening 151a) to etching the sixth layer 136, the third layer 135, the fifth layer 134, the fourth layer 133, the second layer 132 and the first layer 131 sequentially, to form an opening 200 in the stacked structure 130 to expose the conductive structure 103 underneath. In one embodiment, the dry etching process is performed by providing a mixed gas of difluoromethand ($CH_2F_2$), fluoromethane ($CH_3F$), fluoroform ($CHF_3$) and argon (Ar)/oxygen ($O_2$) to etch the sixth layer 136, providing a mixed gas of $C_4F_6$, $C_4F_8$ and Ar/$O_2$ to etch the third layer 135, the fourth layer 133. Also, while etching the fifth layer 134 and the first layer 131 of the stacked structure 130, a mixed gas of $CH_2F_2$, $CH_3F$, $CHF_3$ and Ar/$O_2$, and a small amount of $C_4F_6$ and $C_4F_8$ is provided to alternately etch the corresponding materials, for protecting the sidewall of the opening 200 in the stacked structure 130. However, in another embodiment, each stacked layer is not limited to be etched through the aforementioned gas. Also, in one embodiment, the dry etching process is preferably carried out under a condition of low pressure and high bias, for example, and power condition thereof is more than about 10000 watts (w), for penetrating each stacked layer of the stacked structure 130 to form the opening 200.

Figure 4:
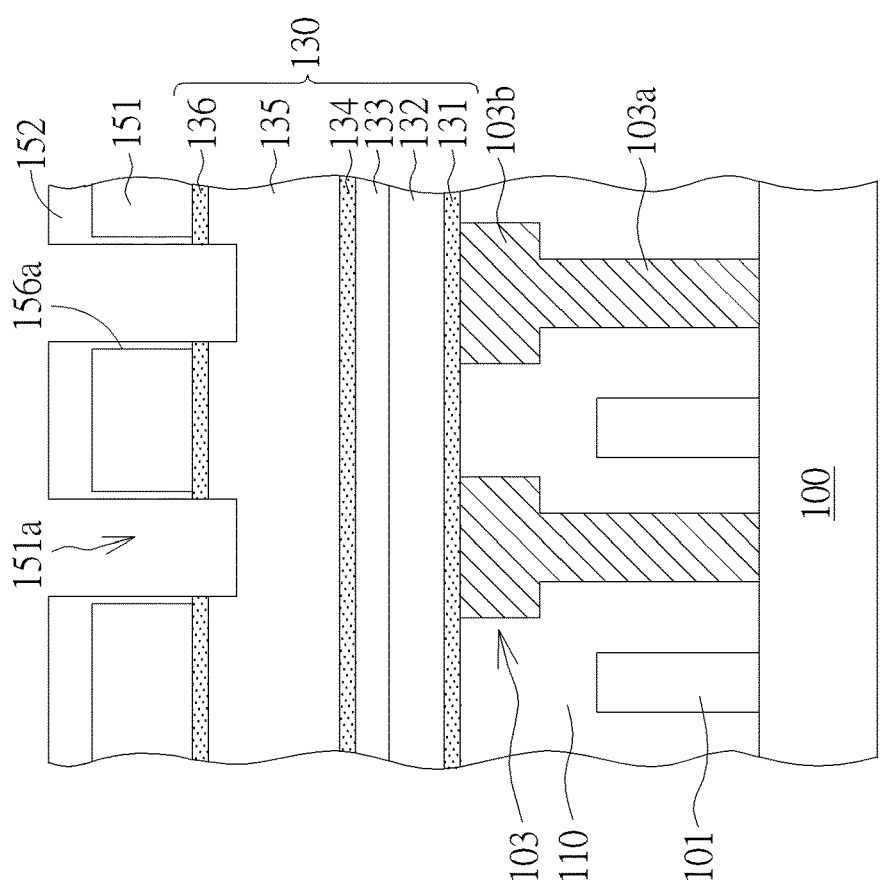

It is noted that, the opening 200 penetrated through the stacked structure 130 has a high aspect ratio, with an upper portion thereof namely the portion being disposed in the sixth layer 136, the third layer 135, the fifth layer 134 and the fourth layer 133 having a vertical sidewall 200a, as shown in FIG. 4. On the other hand, a bottom portion of the opening 200, namely the portion being disposed in the second layer 132 and the first layer 131, has a sidewall 200b being tapered inwardly to the opening 200, as shown in FIG. 4.

Then, the semiconductor memory device is moved to a vacuum machine (not shown in the drawings), for performing a removing process of the patterned mask layer. The removing process includes firstly performing a first removing process, to remove the protection layer 156a, and then performing a second removing process to remove the first mask layer 151 disposed below the protection layer 156a. The second removing process and the first removing process are preferably carried out sequentially, at different chambers of the vacuum machine.

Figure 5:
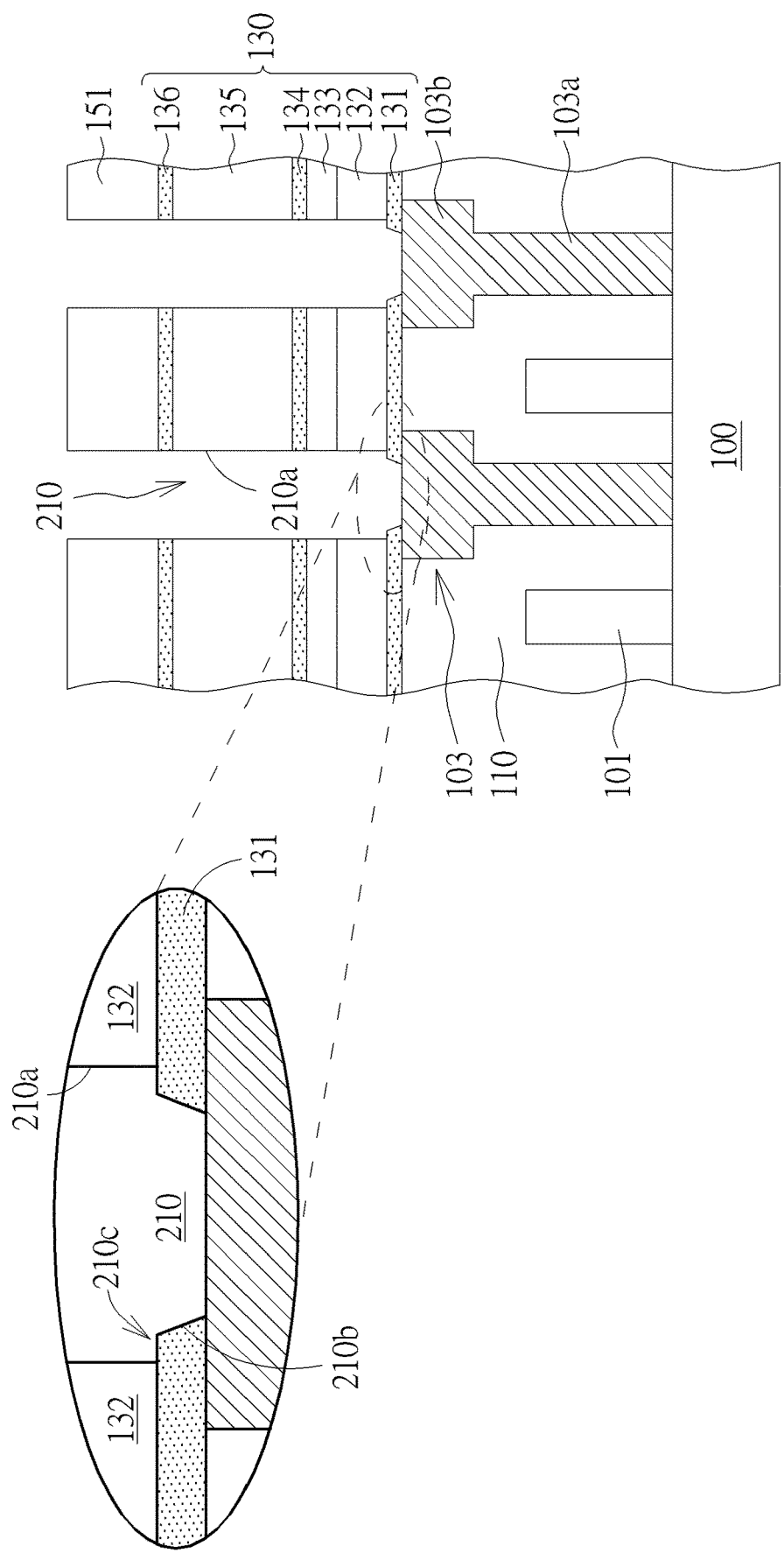

The first removing process such as a soft etching process is performed at a circumstance without exposure to any atmosphere, thereby completely removing the protection layer 156a. In one embodiment, the first removing process is carried out by using a mixed gas of $NF_3$, $NH_3$ and $Ar/O_2$ to etch the protection layer 156a, but is not limited thereto. Furthermore, during the first removing process, the sidewall 200b of the opening 200 within the second layer 132 may also be vertically etched, to form a contact opening 210. That is, the contact opening 210 only has a tapered sidewall 210b within the first layer 131, and has a vertical sidewall 210a in the sixth layer 136, the third layer 135, the fifth layer 134, the fourth layer 133 and the second layer 132, as shown in FIG. 5.

precisely, the vacuum machine includes a filter (not shown in the drawings), which is used to eliminate charged ions, so that, the first removing process may be performed under lower bias, with a bias condition being less than that of the aforementioned dry etching process. Through this arrangement, the etching selectivity between the second layer 132 and the protection layer 156a is significantly increased, for example being about 200 or more than 200 (namely, BPSG/Oxide=200 or more than 200), but is not limited thereto. In other words, the first removing process selectivity removes the protection layer 156a, and also vertically etches the sidewall 200b of the opening 200 in the second layer 132, thereby forming the vertical sidewall 210a. Meanwhile, after vertically etching the sidewall 200b, a top surface of the first layer 131 is partially exposed, so that, the contact opening 210 may therefore obtain a shoulder portion 210c at the boundary between the first layer 131 and the second layer 312, as shown in FIG. 5.

The second removing process such as a soft etching process is also performed at a circumstance without exposure to any atmosphere, to selectivity etch the first mask layer 151, as shown in FIG. 6. In one embodiment, the second removing process is carried out by using a mixed gas of $NF_3$, $CF_4$ and $Ar/O_2$ to etch the first mask layer 151, but is not limited thereto. It is noted that, the second removing process also utilizes the filter within the vacuum machine to eliminate the charged ions, so that, the second removing process is still performed under a lower bias (at a bias being smaller than that of the dry etching process). Through this arrangement, the etching selectivity between the first mask layer 151 and the second layer 132 is significantly increased, for example being about 1000 or more than 1000 (namely, a-Si/BPSG=1000 or more than 1000), but is not limited thereto. That is, only the first mask layer 151 is removed the second removing process, instead of further etching other stacked layers of the stacked structure and the contact opening 210, as shown in FIG. 6.

Finally, as shown in FIG. 7, a deposition process and a planarization process are sequentially performed, to form a plug 215 in the contact opening 210. The plug 215 includes a barrier layer 211 which is conformal formed on surfaces of the contact opening and includes Ti or TiN, and a metal conductive layer 213 for example including a low resistant material like tungsten (W), aluminum (Al) or copper (Cu), but is not limited thereto. Also, a bottom portion of the plug 215 further includes a shoulder portion 215c at the boundary between the first layer 131 and the second layer 132. After that, the capacitor structure which is electrically connected to the plug 215 is formed on the plug 215.

Through the above-mentioned processes, the method of forming a semiconductor memory device according to a preferred embodiment of the present invention is completed. According to the forming method of the present embodiment, the patterned mask layer is firstly used to perform a dry etching process, to dry etch each stacked layers of the stacked structure under a relative smaller etching selectivity, thereby forming the opening 200. Then, the semiconductor memory device is moved to various chambers of the vacuum machine, to perform the removing process of the patterned mask layer, for sequentially removing the protection layer 156a and the first mask layer 151 underneath. Also, while removing the protection layer 156a, the sidewall 200b of the opening 200 in the second layer 132 may also be vertically etched, so as to adjust the tapered sidewall 200b of the opening 200. Accordingly, the contact opening 210 only having the tapered sidewall 210b at the bottom is obtained after the removing process. Thus, the forming method of the present invention is able to adjust the structural defect of the opening 200 with high aspect ratio due to the lack of the process window, during removing the patterned mask layer. In this way, the semiconductor memory device obtained via the aforementioned forming method is allowable to gain the plug 215 with preferable structure, and achieving better capacitance value and performance.

Overall speaking, the forming method of the present invention namely adjusts the structure defect of the primary opening with high aspect ratio, during performing the removing process of the patterned mask layer. The removing process is performed by using a vacuum machine to create a low bias and atmosphere free environment, to enhance the etching selectivity between the patterned mask layer and the stacked structure underneath. In addition, through the present forming method, the tapered sidewall at the bottom of the primary opening is vertical etched while removing the protection layer, followed by selectivity removing the first mask layer. In this way, it is sufficient to improve the structural defect of the primary opening while removing the patterned mask layer, thereby forming a semiconductor memory device with improved structure, such as a dynamic random access memory (DRAM) device, and providing better element performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor memory device, comprising:
   forming a dielectric layer on a semiconductor substrate;
   forming a conductive pad in the dielectric layer;
   forming a stacked structure on the dielectric layer, the stacked structure comprising a first layer, a second layer and a third layer stacked one over another on the conductive pad;
   forming a patterned mask layer on the stacked structure;
   removing a portion of the stacked structure, to form an opening in the stacked structure, the opening comprising a tapered sidewall in the second layer and the first layer;
   vertically etching the tapered sidewalls of the opening in the second layer, to form a contact opening in the stacked structure; and
   removing the patterned mask layer by using an etching selectivity between the second layer and the patterned mask layer.

2. The method of forming the semiconductor memory device according to claim 1, further comprising:
   forming a mask layer on the stacked structure;
   patterning the mask layer to form the patterned mask layer; and
   forming a protection layer on the patterned mask layer.

3. The method of forming the semiconductor memory device according to claim 2, wherein the protection layer is formed while patterning the mask layer.

4. The method of forming the semiconductor memory device according to claim 2, wherein the protection layer has an etching selectivity related to the patterned mask layer.

5. The method of forming the semiconductor memory device according to claim 2, further comprising:
removing the protection layer while performing the vertical etching.

6. The method of forming the semiconductor memory device according to claim 5, wherein the vertical etching is performed by using an etching selectivity between the second layer and the protection layer.

7. The method of forming the semiconductor memory device according to claim 1, wherein the vertical etching is performed by providing $NF_3$ and $NH_3$.

8. The method of forming the semiconductor memory device according to claim 1, wherein the removing of the patterned mask layer is performed by providing $NF_3$ and $CF_4$.

9. The method of forming the semiconductor memory device according to claim 1, wherein the removing of the stacked structure comprising etching the third layer by using $C_4F_6$ and $C_4F_8$.

10. The method of forming the semiconductor memory device according to claim 1, wherein the removing of the stacked structure comprising etching the first layer by using $CHF_3$, $CH_3F$ and $CH_2F_2$.

11. The method of forming the semiconductor memory device according to claim 1, wherein the contact opening comprises a shoulder portion between the first layer and the second layer.

12. The method of forming the semiconductor memory device according to claim 1, wherein contact opening comprises a vertical sidewall in the second layer.

13. The method of forming the semiconductor memory device according to claim 1, wherein a thickness of the second layer is greater than a thickness of the first layer, and a thickness of the third layer is greater than the thickness of the second layer.

14. The method of forming the semiconductor memory device according to claim 1, wherein a portion of the conductive pad is exposed from the contact opening.

15. The method of forming the semiconductor memory device according to claim 1, further comprising:
forming a plug in the contact opening, the plug comprises a barrier layer and a conductive layer.

16. The method of forming the semiconductor memory device according to claim 15, wherein the plug comprises a shoulder portion at a boundary between the first layer and the second layer.

* * * * *